US 6,356,446 B1

(12) United States Patent
Guerrero (10) Patent No.: US 6,356,446 B1
(45) Date of Patent: *Mar. 12, 2002

(54) SLOTTED RAIL HEAT SINK RETAINER CLIP

(75) Inventor: Fred Guerrero, Oxnard, CA (US)

(73) Assignee: PSC Computer Products, Inc., Oxnard, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/395,308

(22) Filed: Sep. 13, 1999

(51) Int. Cl.⁷ .................................................. H05K 7/20
(52) U.S. Cl. .................... 361/704; 24/458; 248/510; 257/719; 361/710; 361/719
(58) Field of Search ............................... 165/86.2, 86.3, 165/185; 174/16.3; 257/707, 713, 718–719, 726–727; 361/704, 707, 709–710, 715, 719–721; 248/296, 505, 510, 316.7; 24/457–458, 573, 625

(56) References Cited

U.S. PATENT DOCUMENTS

| 5,208,731 | A |   | 5/1993  | Blomquist              |
|-----------|---|---|---------|------------------------|
| 5,396,402 | A |   | 3/1995  | Perugini et al.        |
| 5,600,540 | A |   | 2/1997  | Blomquist              |
| 5,662,163 | A | * | 9/1997  | Mira ............... 165/80.3 |
| 5,982,622 | A | * | 11/1999 | Chiou ............... 361/704 |
| 6,008,990 | A | * | 12/1999 | Liu ................... 361/704 |
| 6,046,905 | A | * | 4/2000  | Nelson et al. ....... 361/704 |
| 6,101,091 | A | * | 8/2000  | Baik ................. 361/704 |

* cited by examiner

Primary Examiner—Gregory Thompson
(74) Attorney, Agent, or Firm—Andrea L. Mays (57) ABSTRACT

A heat sink retainer clip for attaching a heat sink to an electronic device and its housing such as a microprocessor module. The clip is comprised of flexible rails having slots that corresponding pins are inserted through. The pins are inserted vertically through registered openings in the heat sink and microprocessor module, and through corresponding holes in the retainer clip. Then the clip is expanded by a handle causing the pins to slide horizontally through the slots and lock into place because the size of the bulb at one end of the pin is larger than the width of the slot. Each pin also contains a spacer for maintaining a fixed distance between components of the microprocessor module and heat sink.

17 Claims, 5 Drawing Sheets

SLOTTED RAIL HEAT SINK RETAINER CLIP

BACKGROUND OF THE INVENTION

1. Field of the Invention (Technical Field)

The present invention relates to cooling of electronic assemblies.

2. Background Art

With the introduction of integrated circuits (ICs), there has been a steady progression toward larger and more complicated IC devices to permit the inclusion of a greater number of functions on the IC. With larger ICs having more circuitry, more heat is produced that is not adequately removed by natural air convection alone nor by powered ventilation, such as a fan.

A heat sink is a device that preferably has a relatively high rate of thermal conductivity and high heat capacity. Because of the material properties of the heat sink and its design, a heat sink can draw heat from any closely situated heat source and dissipate that heat into the surrounding environment. The heat that is generated by ICs must be removed from the area of operation, or else the IC can be ruined.

Convection cooling is performed by the use of a heat sink that is directly applied to the device. It is not desirable to use a bonding process, such as an adhesive, because of the permanent nature of such attachment; an IC may be discarded if malfunctioning and it is not desirable to throw away the heat sink as well as the IC. It has therefore been found beneficial to attach a heat sink to the IC by mechanical means, such as a retainer clip. The typical heat sink in current use comprises a flat plate, generally of the same size as the device, with a plurality of radiation fins extending upwardly. The heat sink is commonly fabricated from aluminum and is extruded and subsequently machined.

A parallel development in the electronic assembly art has been the provision of means for detachably securing large and generally expensive IC devices to a printed circuit board. By detachably securing these expensive ICs, they can be easily removed and repaired when one part of the device becomes damaged or is inoperable. This eliminates the need for fixing the device while it is attached to the printed circuit board, removing the device with possible damage to the sensitive pins, or throwing away the entire IC and printed circuit board. Typically, the industry uses sockets for detachably securing ICs to printed circuit boards. Sockets are permanently attached to the printed circuit board through soldering of downwardly-extending contact pins. These sockets for semi-conductor devices are typically standardized for various ICs and/or IC families.

Recently, however, a new low-cost microprocessor module has been developed that will be used instead of a socket. The microprocessor module consists of the microprocessor IC that is soldered to a small printed circuit board, which is in turn detachably secured to the larger printed circuit board.

To facilitate the proper attachment of the heat sink to the microprocessor module and associated printed circuit board and microprocessor, the printed circuit board within the module is provided with holes that correspond to holes through the plate of the heat sink, through which a retainer clip is inserted. The retainer clip then secures the heat sink to the bottom of the printed circuit board, and at the same time secures the microprocessor module in tight engagement with the heat sink.

Heat sinks to be used with microprocessor modules and printed circuit boards may be of various constructions, but all heat sinks are fabricated or formed from a material with high thermal conductivity, such as aluminum. Heat sinks include a plate with a flat bottom surface. The plate is generally rectangular and its size is co-extensive with the size of the entire device, which includes the printed circuit board and microprocessor module. The heat sink has a large number of fins that are integral with the plate and formed from a single extrusion. In the central region of the heat sink, the fins are machined away to create a channel that extends across the plate.

The heat sink is retained on the entire device by a resilient retainer clip that biases the heat sink into tight thermally conductive relation to the device. That is, the lower surface of the plate is forced against the upper surface of the device.

Prior art heat sink and retainer clip devices are disclosed in U.S. Pat. No. 5,600,540 to Blomquist, entitled "Heat Sink and Retainer for Electronic Integrated Circuits;" U.S. Pat. No. 5,396,402 to Perugini, et al., entitled "Appliance for Attaching Heat Sink to Pin Grid Array and Socket;" and in U.S. Pat. No. 5,208,731 entitled "Heat Dissipating Assembly." U.S. Pat. No. 5,208,731 discloses an assembly for heat dissipation using a spring clip which cooperates with tabs or lugs on opposite side walls of a socket to retain a microprocessor or other IC. U.S. Pat. No. 5,396,402 discloses the use of a clip, which includes a leaf spring and two plastic clips, to be used specifically with a pin grid array chip and pin grid array socket. U.S. Pat. No. 5,600,540 discloses a heat sink and retainer clip to be used with a rectangular socket having opposing side walls, wherein at least two of the side walls have lugs projecting laterally outward. That particular retainer clip is constructed in two pieces; one of which is an elongated strap having a bent portion that bears down upon the heat sink, and another that is rotatably mounted on the end of the first which, when forced down and rotated inward, hooks an opening onto a lug. These prior art devices are made differently and operate differently from the present invention.

The present invention is a simple design to be used with microprocessor modules or any electronic device to be retained against a heat sink, and has the added benefit of producing an evenly-distributed load across the printed circuit board, and microprocessor, during and after installation. The present invention has a flexible slotted rail and pin configuration and a handle for the user to pull back and forth to install and remove the clip.

SUMMARY OF THE INVENTION
(DISCLOSURE OF THE INVENTION)

The present invention is a heat sink retainer clip for biasing an electronic device mounted on a printed circuit board within a housing and a heat sink into heat transfer engagement. The clip comprises at least one rail supported on the housing; at least one pin to be inserted through registered openings in the heat sink, printed circuit board, and housing; a slot in at least one of the rails for receiving the pin; and a handle for positioning the clip relative to the heat sink, printed circuit board, and housing from a first relaxed position to a second biasing position. The pin or pins of the clip preferably comprise a body, a base at one end of the body to abut the heat sink, a spacer at the middle of the body to maintain an approximate fixed distance between the electronic device and the heat sink, and a bulb at the opposite end of the base of the body extending through the slot in the rail to abut the slot when the clip is in the biasing position. Preferably, each pin is comprised of thermoplastic. Preferably, the handle is connected between two corresponding ends of the rails. The rails have at least one arched portion which produces a biasing force and at least one flat portion connected to the arched portion that is in contact with the housing. Preferably, the arched portion produces a biasing force of between approximately 10–20 pounds. The slot in the rail preferably has a registered hole for initially receiving the pin. Preferably, the slot is located so that the end of the slot opposite the registered hole is located at the highest point of the arched portion. The clip is preferably made of resilient stamped metal.

In a preferred embodiment, the heat sink retainer clip is comprised of two rails supported on the housing; four pins to be inserted through registered openings in the heat sink, printed circuit board, and housing; four slots in the two rails which receive the four pins; four holes through the two rails, and adjacent to the four slots, corresponding to the four pins to initially receive the pins; and a handle for positioning the clip relative to the heat sink, printed circuit board, and housing from a first relaxed position to a second biasing position. In this embodiment, the clip further comprises at least one transverse rail connected between the two rails for additional stability. Each of the four pins comprises a body, a base at one end of the body to abut the heat sink, a spacer at the middle of the body to maintain a fixed distance between the electronic device and heat sink, and a bulb at the opposite end of the base of the body to abut the slot when the clip is in the biasing position. Preferably, the four pins are made of thermoplastic. Preferably, the handle is located transverse to the two rails and is used to expand and contract the two rails concurrently into relaxed and biasing positions, respectively. Each of the two rails preferably comprise two arched portions for producing a biasing force directed away from the electronic device, and at least one flat portion adjacent the arched portions for producing a biasing force down upon the electronic device. Preferably, each of the slots is located along one of each of the arched portions, and each of the holes is in communication with and adjacent to a corresponding one of the slots and located upon the flat portions. Preferably, the slots are located so that the end of each slot opposite the hole is located at the highest point of the arched portion. The clip is preferably comprised of resilient stamped metal.

A method of attaching the heat sink to the electronic device is comprised of the steps of inserting at least one pin through corresponding holes in the heat sink and electronic device; aligning the corresponding holes in the retainer clip to the pins; positioning the retainer clip holes over the pins and onto the electronic device; expanding the retainer clip and concurrently sliding the pins through the slots upon the retainer clip; and providing an upward force upon the pins to pull the heat sink into tight engagement with the electronic device while concurrently providing a downward force upon the electronic device by the retainer clip.

The heat sink retainer clip can be used with the heat sink having a base and a plurality of fins, a printed circuit board on which is mounted an electronic device, such as a microprocessor, and a module housing for the printed circuit board. This heat sink retainer clip can comprise at least one rail of resilient material having an elongated slot, and includes at least one flat portion positioned upon an exterior wall of the housing, and at least one arched portion, wherein the elongated slot extends from the flat portion to the arched portion; and at least one pin having a base at one end and a bulb on the other end which passes through registered holes in the heat sink, printed circuit board, and the module housing, such that when the rail is in a first position the bulb protrudes through the flat portion of the elongated slot in the rail, and when moved to a second position where the bulb protrudes through the arched portion of the elongated slot in the rail, the pin base and bulb are biased so as to force the heat sink into heat transfer engagement with the electronic device. This clip can additionally comprise at least one additional rail with an elongated slot, means for attaching the rails in longitudinal alignment, and at least one additional pin passing through registered holes in the heat sink, printed circuit board, and the module housing, so as to provide additional biasing force to the heat sink and electronic device. These elongated slots are bayonet slots, the clip is preferably formed from stainless steel, and the pin is preferably made of plastic.

A primary object of the present invention is to provide a heat sink retainer clip that applies uniform pressure across a printed circuit board, microprocessor, and microprocessor module during and after installation.

Another object of the present invention is to provide a heat sink retainer clip that has a minimum number of working parts, presses easily into place upon the printed circuit board, and retains the heat sink by simply pulling a lever to lock into place.

A primary advantage of the present invention is that no alignment fixtures are necessary to install the retainer clip.

Another advantage is that it can be adapted to fit a variety of heat sinks, printed circuit boards and associated modules.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

Figure 1A:
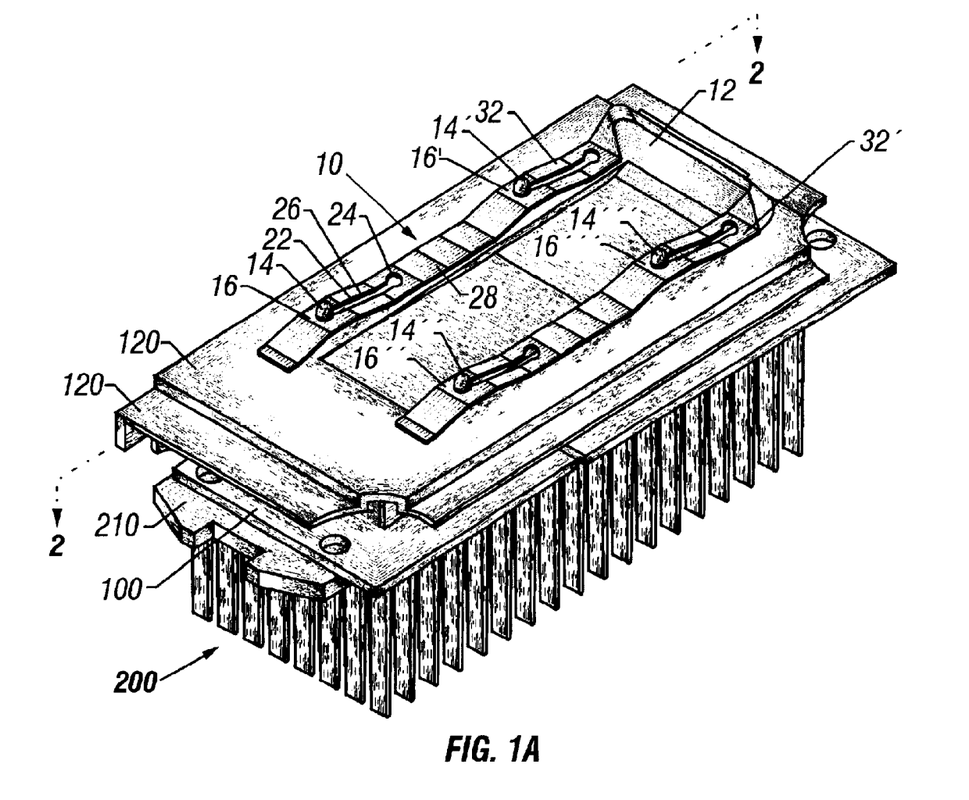
FIG. 1a is a perspective view of a first embodiment of the slotted rail heat sink retainer clip installed on a microprocessor module and heat sink.
Figure 1B:
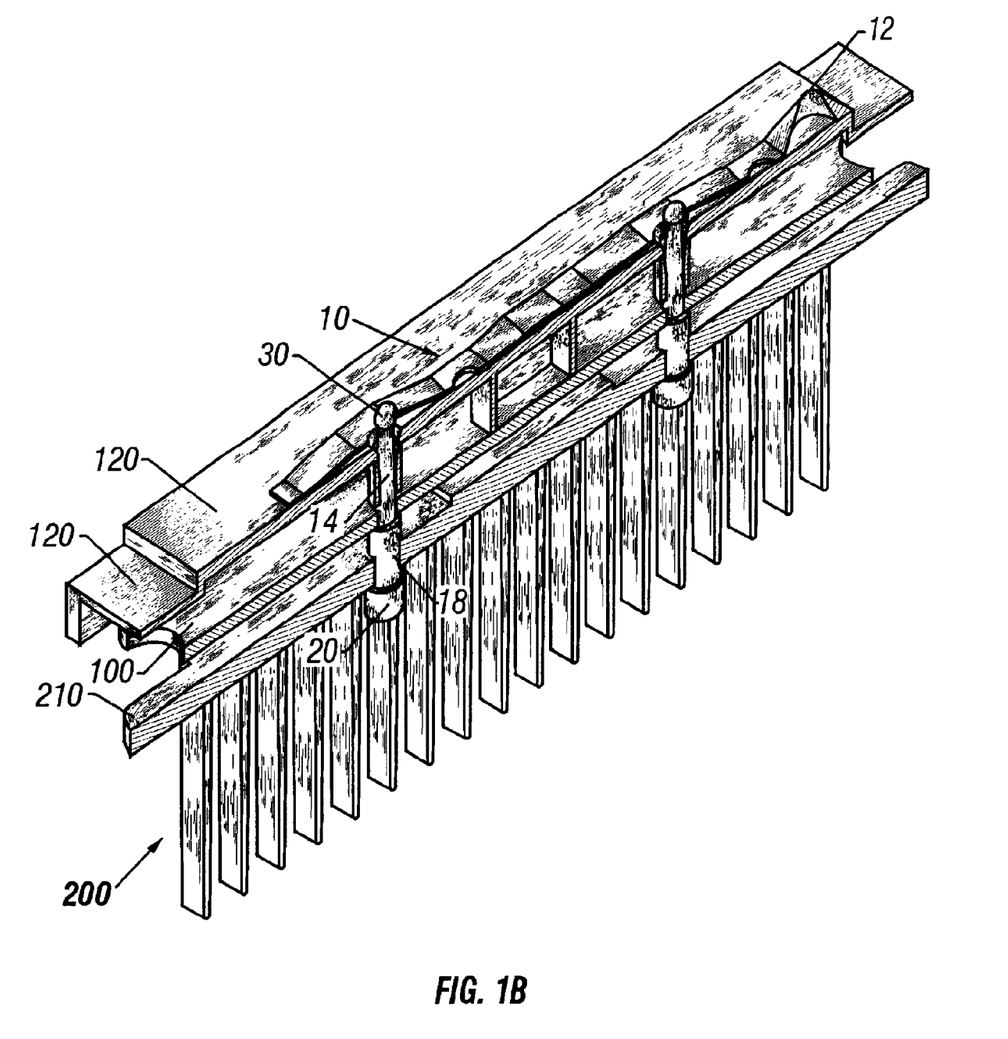
FIG. 1b is a cross-sectional view taken along 2—2 of FIG. 1a showing the pins inserted through the microprocessor module and heat sink.

Attention is now turned to the figures. FIG. 1a is a perspective view of a first embodiment of a slotted rail heat sink retainer clip 10 in the completely assembled biasing position. FIG. 1a shows retainer clip 10 on microprocessor module 120 affixed to heat sink 200. Microprocessor module 120 provides a housing for an electronic device such as a microprocessor mounted on a printed circuit board 100. It is understood that all electronic devices have a "housing" for example, the typical integrated circuit chip is made up of electronic components, e.g. digital logic gates, within a housing where the housing provides protection for the electronics within. Retainer clip 10 has a generally U-shaped configuration comprising a base that serves as a handle 12 and a pair of elongated legs described hereinafter as resilient slotted rails 32 and 32'. Clip 10 is formed from a resilient material such as certain types of plastic or spring steel. As seen best in side elevation view FIG. 2a, each leg of clip 10 has two arched portions 16, 16'. Handle 12 is used to move retainer clip 10 from the relaxed to the biasing position and vice versa. Four pins 14, 14', 14" and 14'" interact with the associated resilient slotted rails 32 and 32' and extend through microprocessor module 120, printed circuit board 100 and heat sink base plate 210 to secure heat sink 200 to printed circuit board 100. Bayonet slots, for example at 26, comprise slot 22 and hole 24. When clip 10 is moved from the relaxed to the biasing position, and vice-versa, it biases the pins 14 upwardly as will be discussed below. FIG. 1b shows a cross-sectional view of FIG. 1a taken along 2—2. It can be seen in FIG. 1b that pin 14 protrudes upward through heat sink base plate 210, printed circuit board 100, and microprocessor module 120 via registered holes, to secure clip 10, microprocessor module 120, and heat sink 200 in engagement so that heat sink base plate 210 is biased in thermal conducting contact with microprocessor 110, the heat source which is better seen in FIGS. 2a and 2b.

Figure 2A:
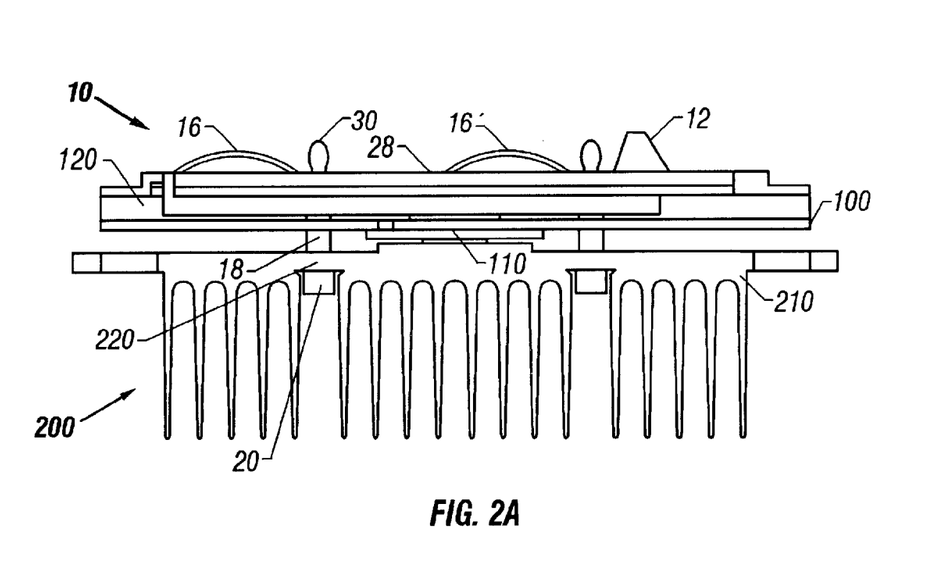
FIG. 2a is a cross-sectional view showing the slotted rail heat sink retainer clip before fully installed.
Figure 2B:
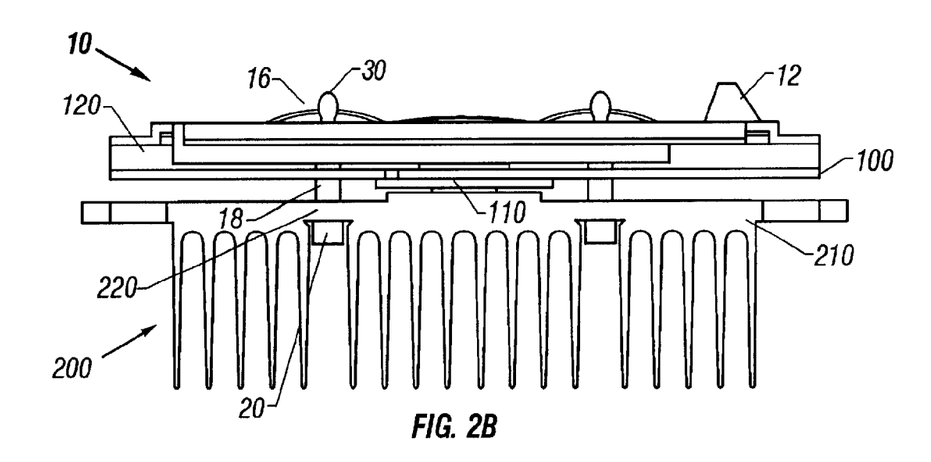
FIG. 2b is a cross-sectional view showing the slotted rail heat sink retainer clip fully installed in the biasing position.

FIGS. 2a and 2b show clip 10 in the relaxed and biasing positions, respectively. Pins 14, 14', 14", 14'" are inserted up through heat sink base plate 210, microprocessor module 120 and printed circuit board 100 and clip 10 is positioned so that holes 24 (shown in FIG. 1a) are aligned over pin bulbs, shown for example at 30. Then clip 10 is placed down over pins 14, 14', 14" and 14'" (shown in FIGS. 1a and 1b), such that pin bulbs 30 protrude through holes 24 of bayonet slots 26. Handle 12 which is either affixed to clip 10 or integral with clip 10 is then pulled to the right (as viewed in FIG. 2a) in order to lock clip 10 into position and thereby retain heat sink 200 in secure engagement with microprocessor module 120. FIG. 2b shows clip 10 in the biasing position after handle 12 has been pulled to the right. It can be seen from FIGS. 2a and 2b that upon pulling handle 12 to the right, pins 14, 14', 14", 14'", progress through bayonet slot 22 (see FIG. 1a) such that they stop at the left-most end in slot 22 and are then held securely in that position. Because clip 10 has arched portions 16, and because slot 22 ends at the peak of arched portion 16, pin 14 is necessarily pulled upwardly when at the left-most end of slot 22. It can be seen that arched portion 16 of slotted rail 32 is then centered with respect to pin 14 and therefore produces an upward biasing force on pin bulb 30, forcing pin 14 upward such that pin base 20 firmly biases the heat sink base plate 210 into engagement with microprocessor 110. Because pin bulb 30 is larger in diameter than the width of slot 22, pin 14 is held securely and clip 10 is also held securely in the fully assembled position such that microprocessor module 120 and heat sink 200 are in secure engagement. Because of this biased engagement of microprocessor module 120 and heat sink base plate 210, microprocessor 110 and heat sink base plate 210 are in tight heat conducting engagement. Spacer 18 on pin 14 keeps printed circuit board 100 and heat sink base plate 210 in tight engagement such that microprocessor 110 on printed circuit board 100 when biased by pins 14 and clip 10 will not deflect the printed circuit board.

Figure 3:
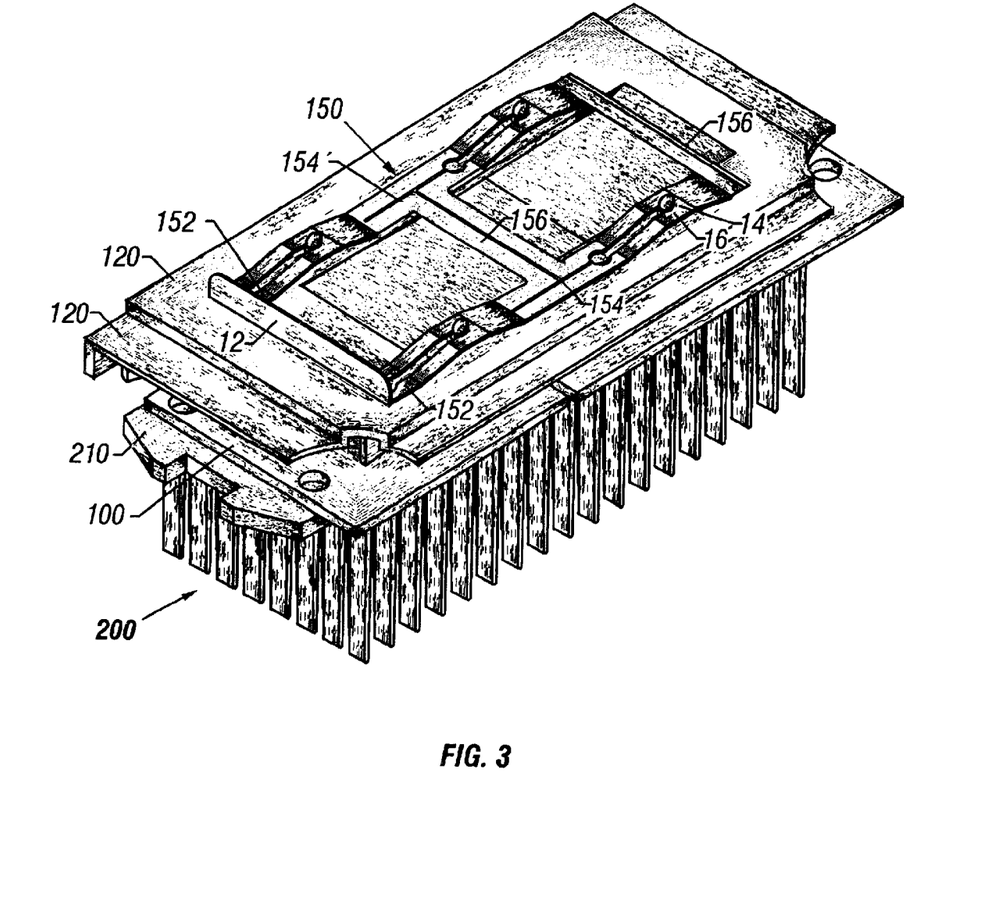
FIG. 3 is a perspective view of a second embodiment of the slotted rail heat sink retainer clip installed on a microprocessor module and heat sink.

FIG. 3 shows a perspective view of a second embodiment of clip 150, microprocessor module 120 and heat sink 200. Clip 150 includes slotted rails such as the one shown at 152 with flat portions 154 which press down upon microprocessor module 120 when clip 150 is locked into place. An additional center rail 156 extends transversely from flat portion 154 of slotted rail 152 to flat portion 154' of slotted rail 152' to provide strength, stability and added pressure against microprocessor module 120 when in the biasing position. An additional end rail 158 also provides strength, stability, and added pressure against microprocessor module 120.

It is to be understood that FIGS. 1a and 3 show just two possible embodiments of the invention. It will be apparent to those skilled in the art that more than two flexible slotted rails 32 and 32' or 152 and 152' can be used to provide additional biasing force between microprocessor 110 and heat sink 200. It will also be apparent that the invention can be configured with just one slotted rail. Also, any number of transverse rails such as 156 and 158 can be used. Furthermore, any number of bayonet slots and associated pins can be used.

Figure 4:
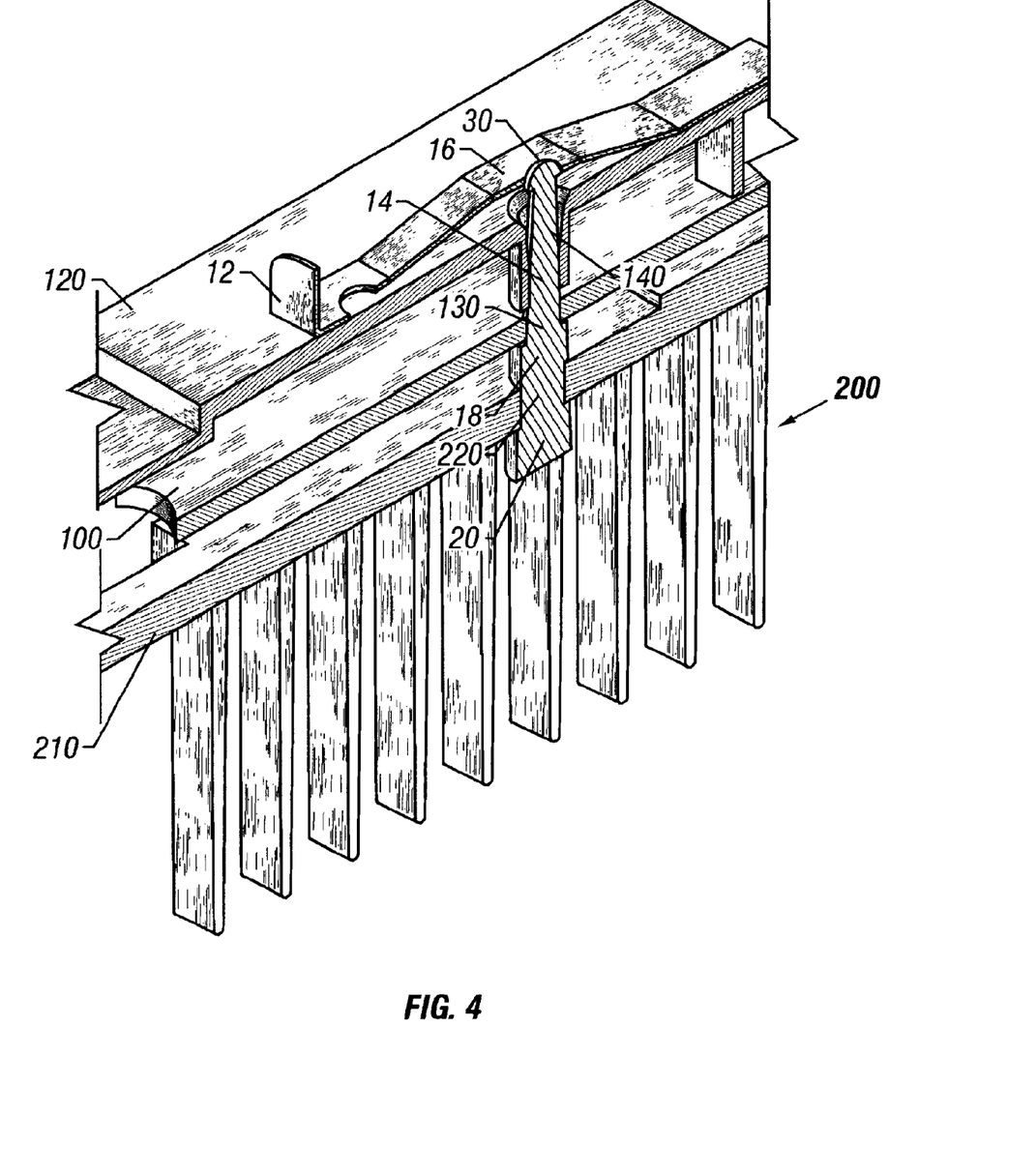
FIG. 4 is an enlarged view of a pin of the slotted rail heat sink retainer clip in the biasing position.

FIG. 4 shows an enlarged view of pin 14 inserted through heat sink 200, microprocessor module 120, and printed circuit board 100. Pin 14 is first pushed through heat sink base plate 210 via hole 220. Pin 14 is inserted upward through the bottom of heat sink base plate 210. Pin 14 continues through corresponding hole 130 in printed circuit board 100, hole 140 of microprocessor module 120 and through hole 24 of bayonet slot 26 of slotted rail 32 of clip 10 (see FIG. 1a, although the configuration is also applicable to FIG. 3). Pin bulb 30 of pin 14 retains pin 14 in slot 22 (see FIG. 1a) when in the biasing position. Arched portion 16 of slotted rail 32 or 152 produces an upward biasing or clamping force upon pin 14 via bulb 30 when in the biasing position. Pin base 20 then presses firmly against the bottom surface of heat sink base plate 210, thereby pulling heat sink 200 and printed circuit board 100 together into heat transfer engagement. Spacer 18 of pin 14 insures that heat sink 200 and printed circuit board 100 are not pressed too tightly against one another, and allows room for microprocessor 110 (see FIGS. 2a and 2b) between printed circuit board 100 and heat sink 200. When clip 10 is installed and in the biasing position, spacer 18 also prevents extra pressure from being applied directly to printed circuit board 100 if, for example, the entire unit is dropped onto a hard surface. The shock of being dropped could otherwise cause printed circuit board 100 to break around the microprocessor because it is mounted in between printed circuit board 100 and heat sink base plate 210.

With this unique configuration, the user need only center clip 10, or clip 150, over pins 14, 14', 14", or 14'", place holes 24 of slotted rails 32, or 152, over pins 14, then pull handle 12 to the right to lock clip 10, or 150, into a biasing position. When the user is pulling handle 12 to the right and expanding clip 10, or 150, an equal amount of force is concurrently applied across all four pins 14, 14', 14" and 14'", and this even force is also applied across heat sink base plate 210 and printed circuit board 100. This is beneficial because if an unequal amount of force is applied at the four different positions of pin 14, stress is applied to microprocessor module 120, printed circuit board 100, microprocessor 110, and heat sink 200, and could potentially crack or break any or all of them. By pushing handle 12 back to the left, clip 10, or 150, is contracted and the clip can be removed easily from pins 14 through holes 24.

In the preferred embodiment, pin 14 is preferably made of thermal plastic, although other materials can be used. Clip 10 or 150 is most preferably made of a resilient stamped metal such as stainless steel. Because of the simple design of the heat sink retainer clip 10 or 150, no special assembly alignment fixtures are needed. Furthermore, heat sink retainer clip 10 or 150 can be used with a variety of heat sink designs. In the preferred embodiment, arched portion 16 of slotted rail 32 or 152 preferably provides a clamping force of between 13 and 20 pounds, 14.5 pounds has been found to be highly satisfactory for the embodiment shown in FIGS. 1 and 2. The combination of this clamping force and spacer 18 provides a secure enough engagement to allow heat dissipated from microprocessor 110 to be transferred effectively into heat sink 200 while not allowing printed circuit board 100 to over-deflect around microprocessor 110.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A heat sink retainer clip assembly for biasing an electronic device mounted on a printed circuit board within a housing and a heat sink into heat transfer engagement, the heat sink, printed circuit board and housing each having at least one opening in registry, said clip assembly comprising:
    at least two rails supportable on the housing, each of said at least two rails comprising at least one arched portion for producing a biasing force, and a flat portion contiguous with and on each end of said at least one arched portion contactable with the housing;
    at least two pins for insertion through the registered openings in the heat sink, printed circuit board, and housing;
    at least one slot in each of said rails, each of said slots corresponding to and for receiving one of said pins, each of said slots comprising a registered hole for initially receiving said corresponding pin, said hole located upon said flat portion of one of said rails and comprising one end of its respective slot, said slot extending from said hole to the highest point of one of said at least one arched portion; and
    a handle for positioning said clip assembly relative to the heat sink, printed circuit board, and housing from a first relaxed position to a second biasing position.

2. The clip assembly of claim 1 wherein each of said pins comprises:
    a body;
    a base at one end of said body to abut the heat sink;
    a spacer at the middle of said body to maintain an approximate fixed distance between the electronic device and the heat sink; and
    a bulb at the opposite end of said base of said body to abut said slot when said clip assembly is in the biasing position.

3. The clip assembly of claim 2 wherein each of said pins is comprised of at least one material selected from the group consisting of thermoplastic and steel.

4. The clip assembly of claim 1 wherein said clip assembly comprises two rails and said handle is affixed between two corresponding ends of said two rails.

5. The clip assembly of claim 1 wherein each of said at least one arched portion produces a biasing force of between approximately ten and twenty pounds.

6. The clip assembly of claim 1 wherein said at least two rails are comprised of resilient stamped metal.

7. A heat sink retainer clip assembly for biasing an electronic device mounted on a printed circuit board within a housing and a heat sink into heat transfer engagement, said clip assembly comprising:
    two rails supportable on the housing, each of said rails comprising two arched portions for producing a biasing force between the electronic device and the heat sink and a flat portion contiguous with and on each end of said arched portions contactable with the housing;
    multiple pins each insertable through a registered opening in the heat sink, printed circuit board, and housing;
    multiple bayonet slots, in each of said two rails, each for receiving one of said pins, each of said slots located so that the enlarged portion is located in said flat portion and the slot portion extends from said enlarged portion onto one of said arched portions, wherein the end of said slot opposite said enlarged portion is located at the highest point of said one of said arched portions; and
    a handle for positioning said clip assembly relative to the heat sink, printed circuit board, and housing from a first relaxed position to a second biasing position.

8. The clip assembly of claim 7 further comprising at least one transverse rail connected between said two rails.

9. The clip assembly of claim 7 wherein each of said multiple pins comprises:
    a body;
    a base at one end of said body to abut the heat sink;
    a spacer at the middle of said body to maintain a fixed distance between the electronic device and the heat sink; and
    a bulb at the opposite end of said base of said body to abut said slot when said clip assembly is in the biasing position.

10. The clip assembly of claim 7 wherein each of said pins is comprised of at least one material selected from the group consisting of thermoplastic and steel.

11. The clip assembly of claim 7 wherein said handle comprises a handle located transverse to said two rails for expanding and contracting said two rails of said clip assembly concurrently into relaxed and biasing positions respectively.

12. The clip assembly of claim 7 wherein said two rails are formed of resilient stamped metal.

13. A heat sink retainer clip assembly for use with a heat sink having a base and a plurality of fins, a printed circuit board on which is mounted an electronic device, such as a microprocessor, and a module providing a housing for the printed circuit board and electronic device, comprising:
    at least two rails of resilient material each having at least one elongated slot, and including a flat portion positionable upon an exterior wall of the housing and at least one arched portion contiguous with said flat portion, each of said elongated slots extending from said flat portion to the highest point on one of said arched portions; and
    multiple pins corresponding to each of said slots each having a base at one end and a bulb on the other and passable through respective registered holes in the heat sink, printed circuit board, and the housing, whereby when each of said at least two rails is in a first position said bulb can protrude through the flat portion of said corresponding slot, and when moved to a second position said bulb can protrude through the arched portion of said corresponding slot, thereby causing the pin base and bulb to be biased so as to force the heat sink into heat transfer engagement with the electronic device.

14. The clip assembly of claim 13 wherein each of said rails comprises at least two arched portions and at least two elongated slots corresponding to said arched portions and means attaching said rails in longitudinal alignment.

15. The clip assembly of claim 13 wherein each of said elongated slots are bayonet slots.

16. The clip assembly of claim 13 wherein said at least two rails is formed from stainless steel.

17. The clip assembly of claim 13 wherein each of said pins are plastic.

* * * * *